United States Patent [19]
Yoon

[11] Patent Number: 5,563,788
[45] Date of Patent: Oct. 8, 1996

[54] VEHICULAR SELF-TEST SYSTEM OF ELECTRONIC COMPONENT CONTROLLING DEVICE AND A METHOD FOR SELF-TESTING

[75] Inventor: Heunjung Yoon, Kyungki-do, Rep. of Korea

[73] Assignee: Hyundai Motor Co., Seoul, Rep. of Korea

[21] Appl. No.: 603,355

[22] Filed: Feb. 20, 1996

Related U.S. Application Data

[63] Continuation of Ser. No. 306,608, Sep. 15, 1994, abandoned.

[30] Foreign Application Priority Data

Sep. 22, 1993 [KR] Rep. of Korea ............... 93-19315

[51] Int. Cl.⁶ ............................................. G01M 17/00
[52] U.S. Cl. ............................... 364/424.03; 364/431.11
[58] Field of Search ............................. 364/550, 551.01, 364/424.03, 424.04, 431.11; 73/116, 117.2, 117.3, 118.1

[56] References Cited

U.S. PATENT DOCUMENTS

| | | | |
|---|---|---|---|
| 4,597,052 | 6/1986 | Matsuda | 364/550 |
| 4,831,560 | 5/1989 | Zaleski | 364/551.01 |
| 4,843,557 | 6/1989 | Ina et al. | 364/431.11 |
| 4,899,292 | 2/1990 | Montagna et al. | 364/401 |
| 4,996,643 | 2/1991 | Sakamoto et al. | 364/424.03 |
| 5,034,894 | 7/1991 | Abe | 364/431.01 |
| 5,272,769 | 12/1993 | Strnatka et al. | 395/161 |
| 5,276,619 | 1/1994 | Ohara et al. | 364/424.04 |
| 5,278,759 | 1/1994 | Berra et al. | 364/424.01 |
| 5,318,449 | 6/1994 | Schoell et al. | 434/305 |
| 5,331,560 | 7/1994 | Tamura | 364/431.12 |
| 5,345,384 | 9/1994 | Przybyla et al. | 364/424.04 |

*Primary Examiner*—Michael Zanelli

[57] ABSTRACT

The present invention discloses a self-test system of an electronic component controlling device and a method for self-testing that can test the operation state of the vehicle electronic component controlling device at a user's will. The inventive system includes a power supplying device, an electronic controller, a first interface, a self-test controller, a memory, a data output member, and a data input member.

17 Claims, 6 Drawing Sheets

VEHICULAR SELF-TEST SYSTEM OF ELECTRONIC COMPONENT CONTROLLING DEVICE AND A METHOD FOR SELF-TESTING

This application is a continuation of application Ser. No. 08/306,608 filed on Sep. 15, 1994, now abandoned.

BACKGROUND OF THE INVENTION

1. Field of the Invention

The present invention relates to a self-test system of an electronic component controlling device and a method for self-testing. More particularly, the present invention relates to a self-test system of an electronic component controlling device and a method for self-testing that can test the operation state of the vehicle electronic component controlling device at a user's will.

2. Description of the Related Art

A conventional self-test system for testing the operation state of electronic devices, includes an additional self-test system for testing the condition of the electronic control device respectively mounted on a plurality of electronic devices to watch the operation of the electronic devices. Data about communication characteristics of each electronic device separate memory means is stored by means of additional memory means to communicate data.

If the operation condition of the electronic device is determined by means of the additional self-test system, as the communication system according to each electronic device varies, new memory means should be developed, and the communication speed is too slow.

Moreover, since the data about the communication characteristics of each electronic device is not exactly known, it is impossible to perform the self-test operation and confirm or simulate the operation state by means of an additional computer.

SUMMARY OF THE INVENTION

The present invention is made in an effort to solve the above conventional problems and provides an electronic test system of an electronic component controlling device and a method for testing that can output corresponding data, a controlling device determining the operation state of the other electronic component controlling device.

In order to achieve the above object of this invention, the present invention comprises:

power supplying means for supplying power necessary to each electronic device and self-test system;

an electronic controlling part having a plurality of electronic controlling devices for outputting a control signal to perform the operation of each electronic device;

a first interface connected to the electronic controlling part to communicate with said electronic controlling part;

self-test controlling means, connected to the power supplying means and to the first interface means, for displaying vehicle types to select one corresponding vehicle type for confirming the operation state of the electronic controlling device of a vehicle, selecting a desired electronic controlling device, by displaying all the electronic controlling devices mounted on a selected vehicle, provided the corresponding vehicle type is selected from among the displayed vehicle types, selecting a desired operation by displaying an operation that can be performed, provided a corresponding electronic controlling device is selected, and stopping the selection operation and performing the operation of the previous step, provided a signal for stopping the operation is selected from among the operations;

memory means, connected to the self-test controlling means, for storing necessary data and reading the stored data;

data output means, connected to the self-test controlling means and to the memory means, for outputting data applied from the self-test controlling means according to a control signal of the self-test controlling means; and data input means, connected to the data output means and to the self-test controlling means, for enabling the self-test controlling means to perform the selected operation to input a selected data to determine the operation state of an electronic component controlling device of a desired vehicle.

DETAILED DESCRIPTION OF PREFERRED EMBODIMENTS

Preferred embodiments of the present invention are now described in detail with reference to the accompanying drawings.

Figure 1:
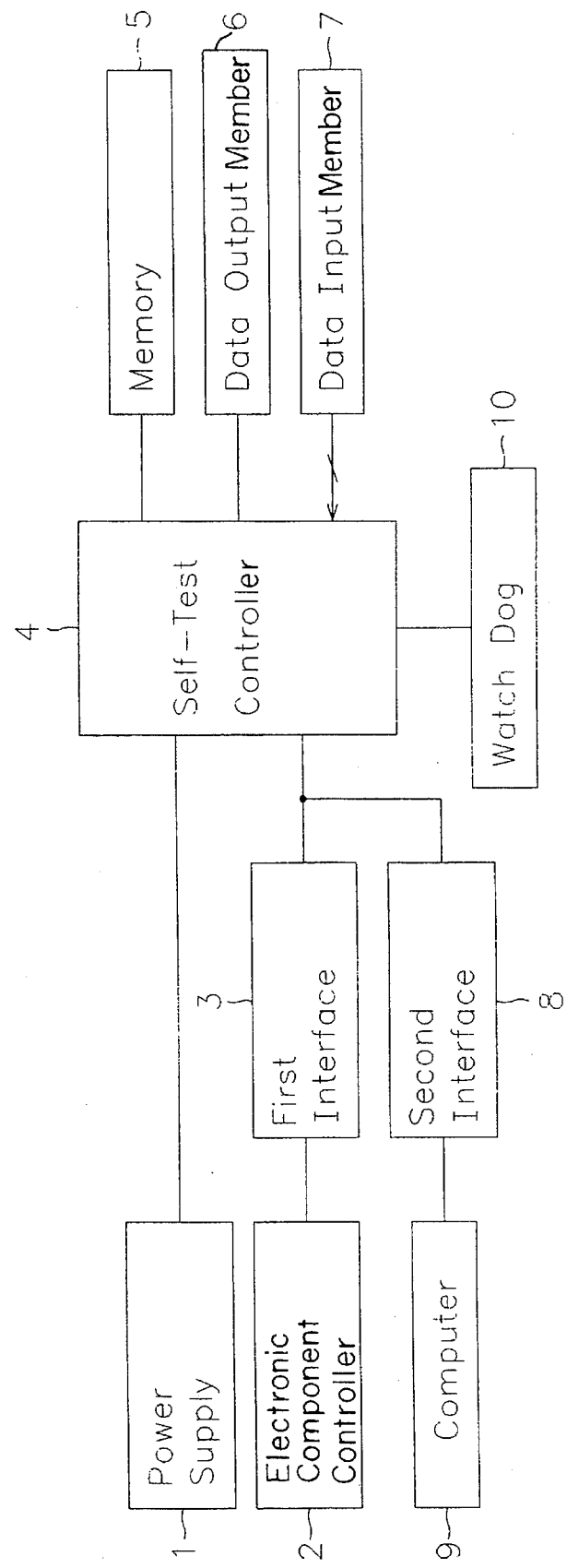
FIG. 1 is a block diagram of a self-test system of an electronic component control device in accordance with a preferred embodiment of the present invention.

Referring to FIG. 1, the present invention includes a power supply 1 for supplying power necessary to each electronic device and self-test system; an electronic component controller 2 for outputting a control signal to perform the operation of each electronic device; a first interface connected to the electronic component controller 2; a self-test controller 4 connected to the power supply 1 and first interface 3; a memory 5 connected to the self-test controller 4 to store necessary data; a data output member 6 connected to the self-test controller 4 and memory 5 to output data; a data input member 7 connected to the data output member 6 and self-test controller 4; a second interface 8 connected to the self-test controller 4; a computer 9 connected to the second interface 8; and a watch dog member 10 connected to the self-test controller 4.

Figure 2:
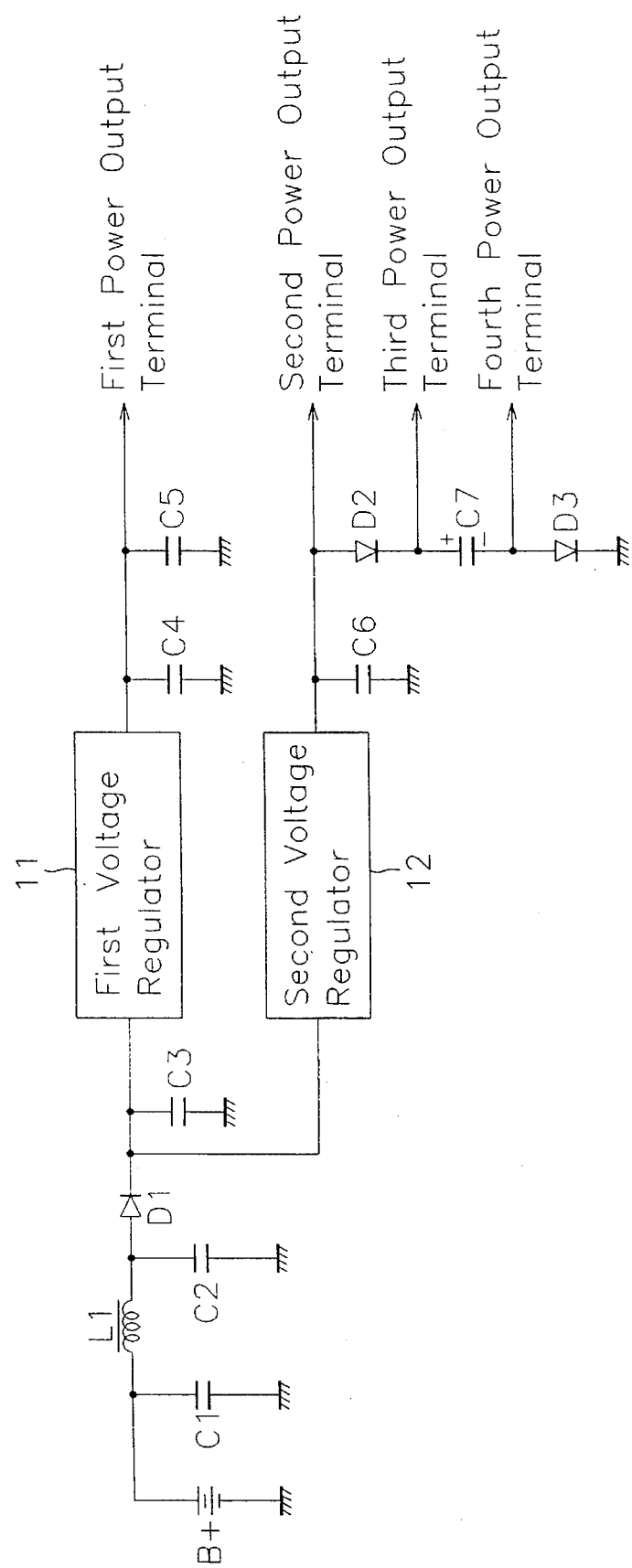
FIG. 2 is a detailed circuit diagram of a power supplying part in accordance with a preferred embodiment of the present invention.

Referring now to FIG. 2, the power supply 1 includes: a capacitor C1 having one-side terminal connected to power B+ and grounded; a coil L1 having one-side terminal connected to power B+; a capacitor C2 having one-side terminal connected to the other terminal of the coil L1 and grounded;

a diode D1 having an anode terminal connected to the other terminal of the coil L1; a capacitor C3 having one-side terminal connected to a cathode terminal of the diode D1; a first voltage regulator 11 connected to one-side terminal of the capacitor C3; a capacitor C4 having one-side terminal connected to the first voltage regulator 11 and grounded; a capacitor C5 having one-side terminal connected to the first voltage regulator 11 and grounded; a second voltage regulator 12 connected to a cathode terminal of the diode D1; a capacitor C6 having one-side terminal connected to the second voltage regulator 12 and grounded; a diode D2 having an anode terminal connected to the second voltage regulator 12; a capacitor C7 having one-side terminal connected to a cathode terminal of the diode D2; and a diode D3 having an anode terminal connected to the other side-terminal of the capacitor C7 and grounded.

Figure 3:
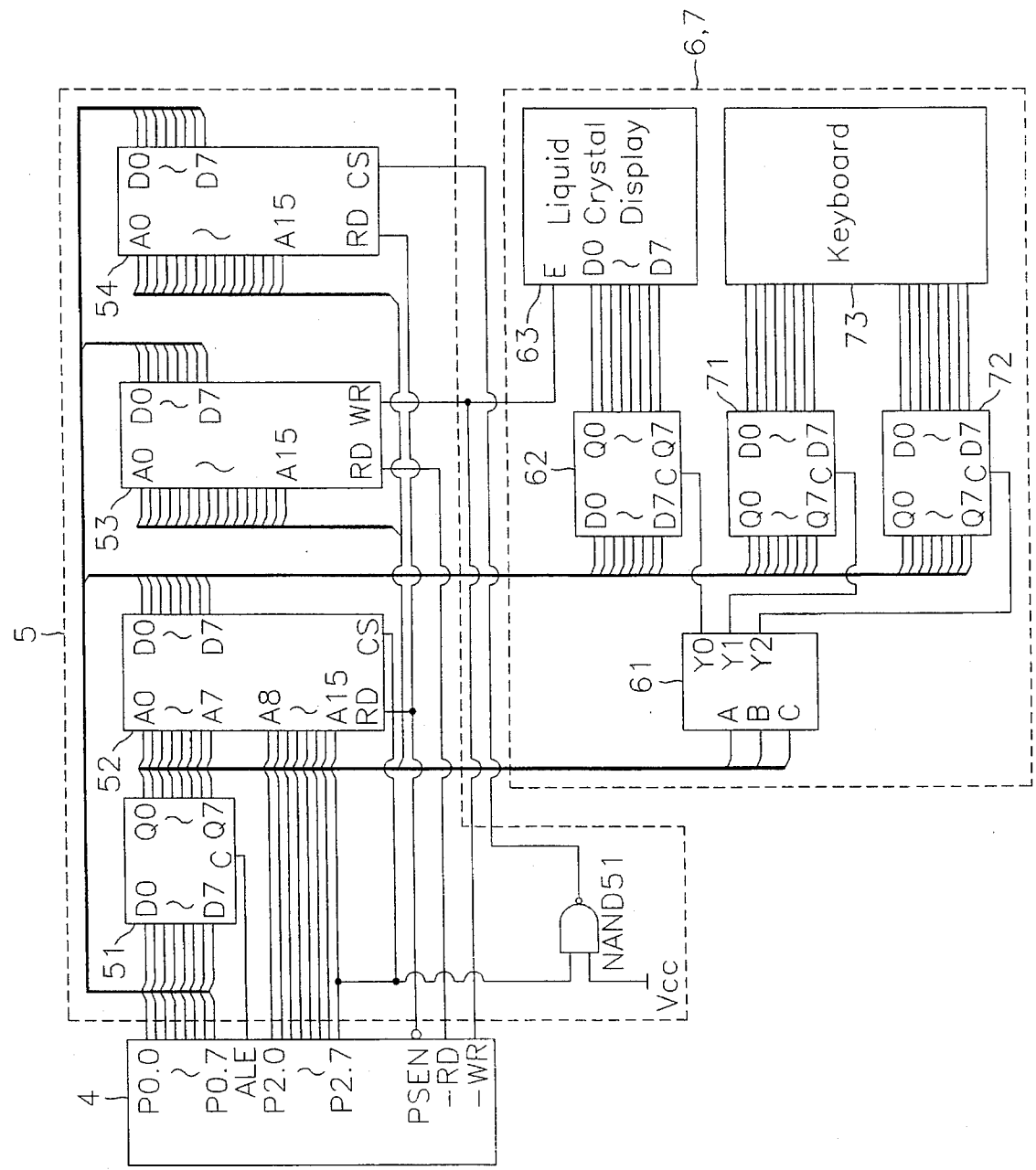
FIG. 3 is a detailed circuit diagram of a memory part, a data output part and a data input part in accordance with a preferred embodiment of the present invention.
Figure 4:
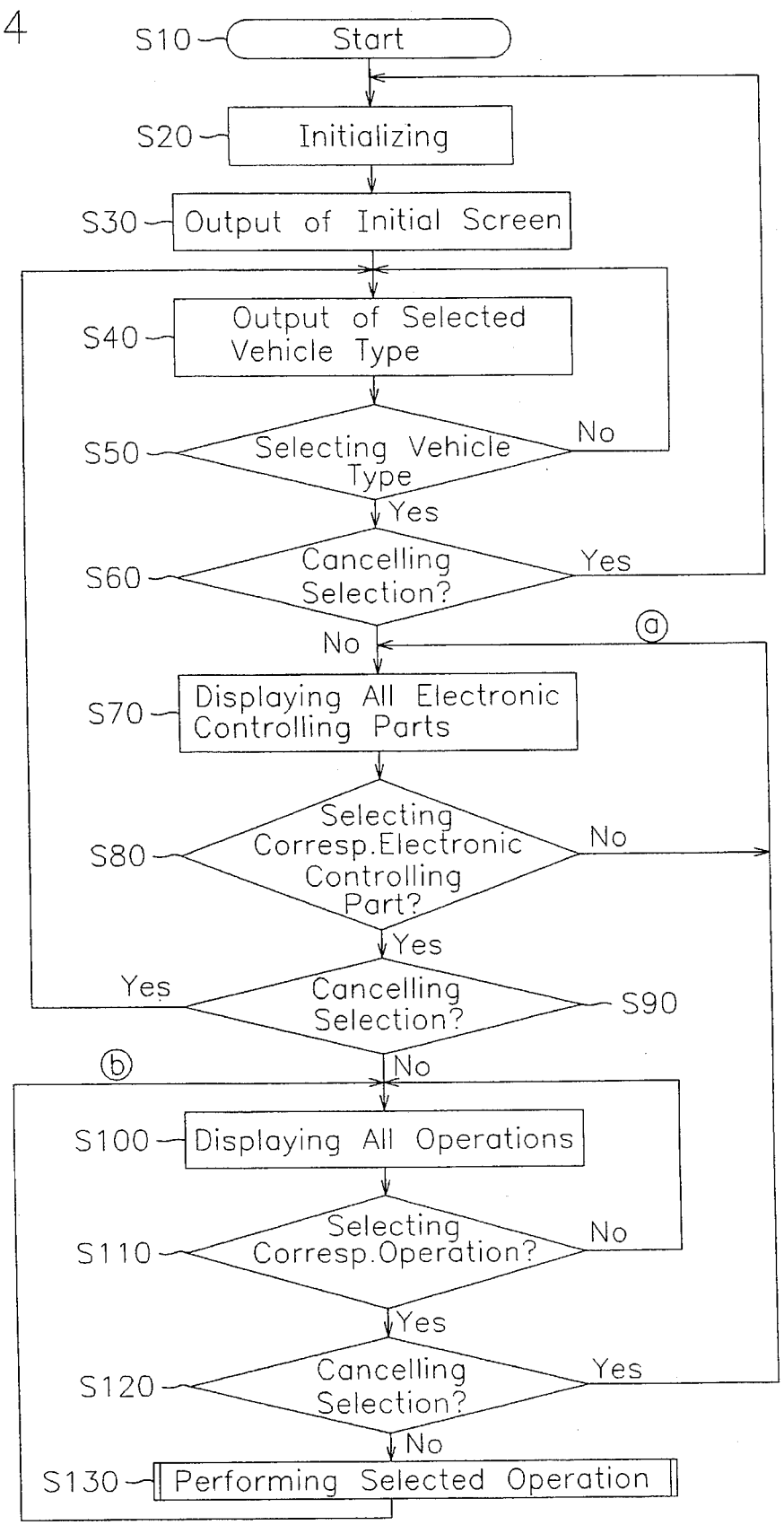
FIG. 4 shows the steps in the self-test operation of the electronic component controlling device in accordance with the present invention.
Figure 5A:
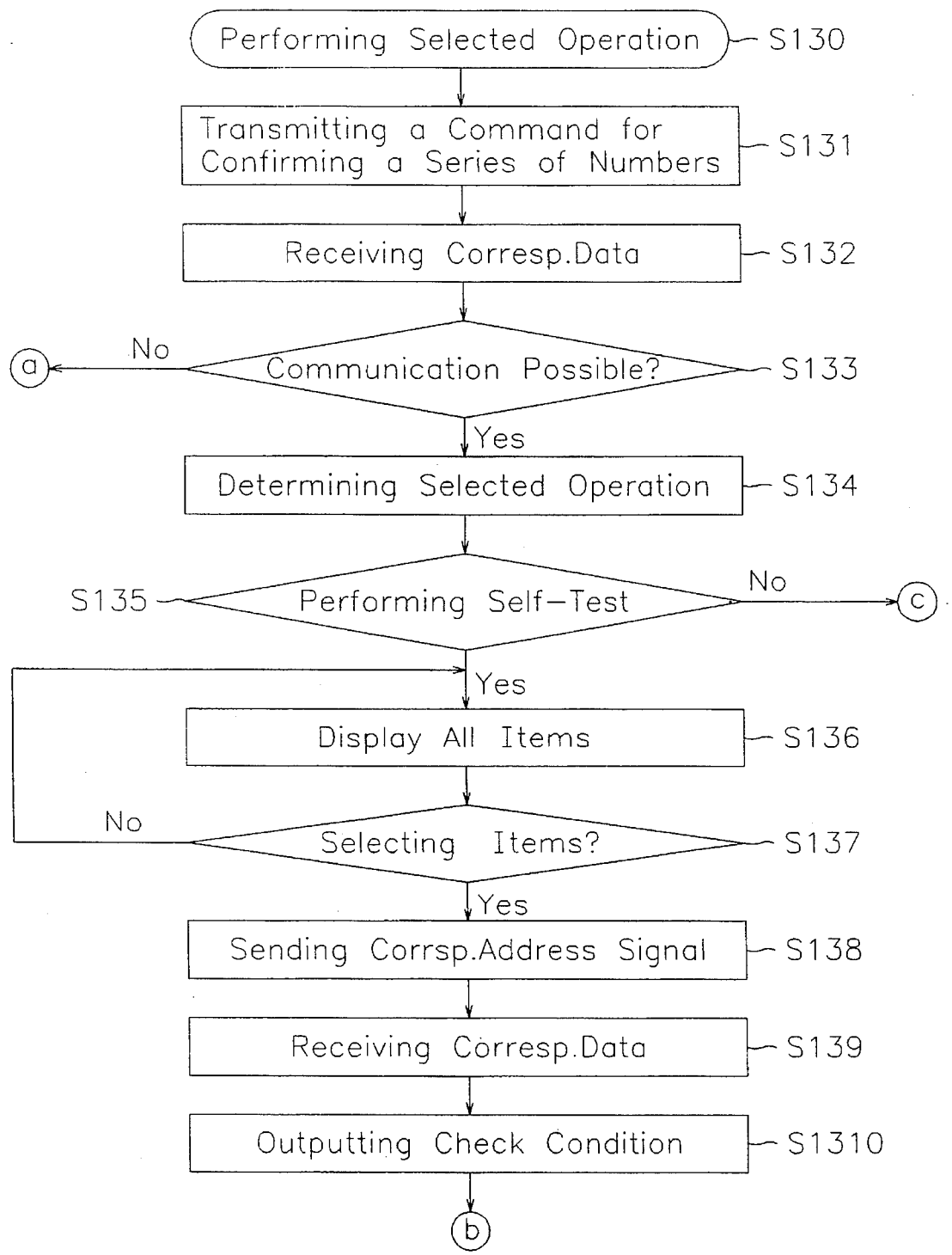
FIGS. 5A and 5B show the steps in performing the selected operation in accordance with a preferred embodiment of the present invention.
Figure 5B:
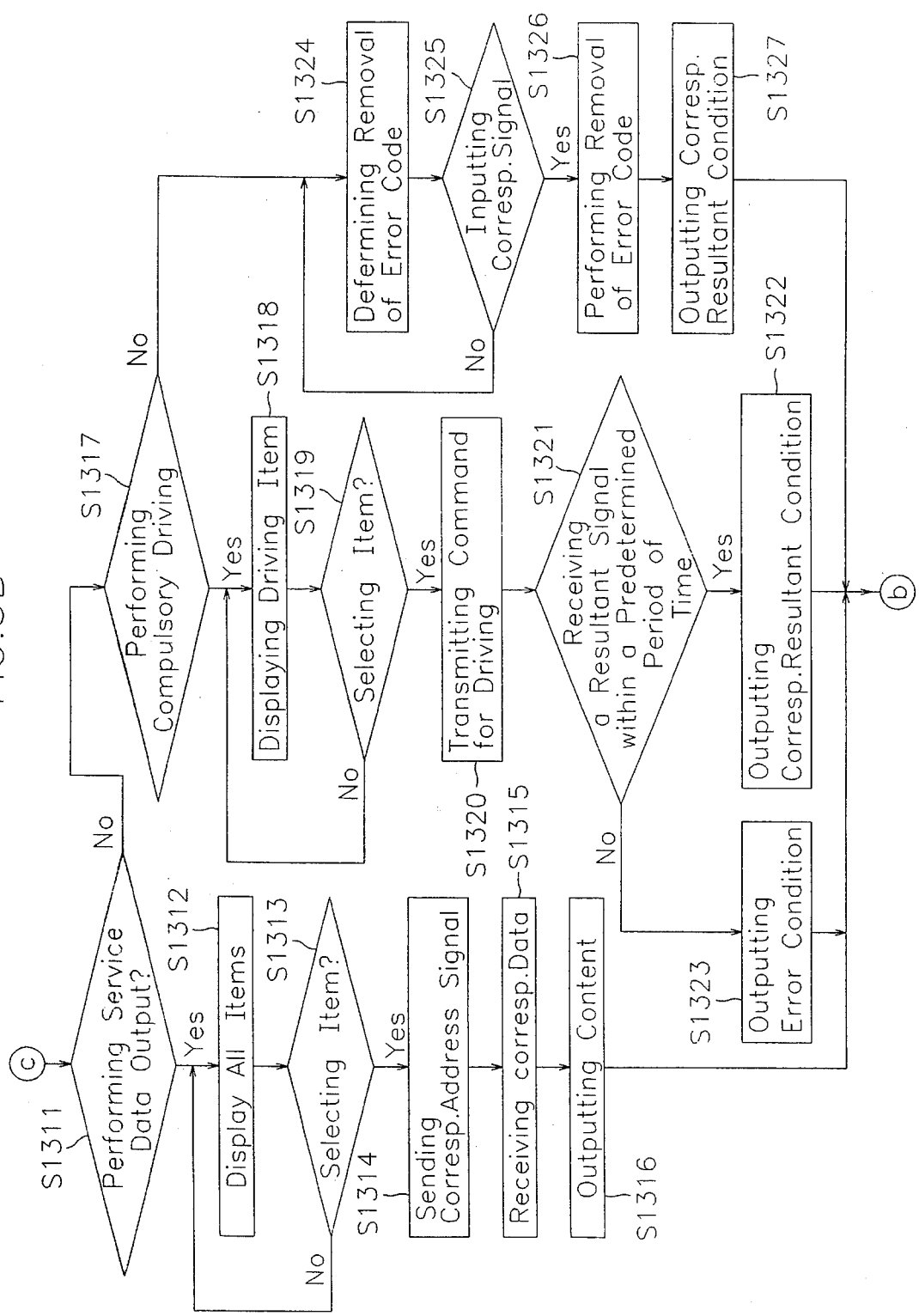

Referring now to FIG. 3, the memory 5 includes: a latch 51 having input terminals D0 to D7 connected to a first port P0.0 to P0.7 of a self-test controller 4 and an enable terminal C connected to an address latch enable (ALE) of the self-test controller 4; a first read only memory 52 (ROM) having address terminals A0 to A7 connected to output terminals Q0 to Q7 of the latch 51, address terminals A8 to A15 connected to second ports P2.0 to P2.7 of the self-test controller 4, a chip selection terminal CS connected to a terminal P2.7 of the second ports, a read terminal RD connected to a program store enable terminal (PSEN), and data terminals D0 to D7 connected to the first ports P0.0 to P0.7 of the self-test controller 4; a random access memory 53 having address terminals A0 to A15 connected to address terminals A0 to A15 of the first ROM 52, a read terminal RD connected to a -read terminal (-RD) of the self-test controller 4, a wright terminal WR connected to a wright terminal (-WR) of the self-test controller 4, and data terminals D0 to D7 connected to the data terminals D0 to D7 of the first ROM 52; NAND gate NAND51 having a first input terminal connected to the second port terminal P2.7 of the self-test controlling part 4 and power Vcc connected to the second input terminal; and a second ROM 54 having address terminals A0 to A15 connected to the address terminals A0 to A15 of the first ROM 52, a read terminal RD connected to PSEN of the self-test controller 4, and a chip selection terminal CS connected to an output terminal of the NAND gate NAND51.

Referring now to FIG. 3, the data output member 6 and the data input member 7 include: a decoder 61 having input terminals A to C connected to address terminals A0 to A15 of the first ROM 52 of the memory 5; a first latch 62 having an enable terminal C connected to an output terminal YO of the decoder 61 and input terminals D0 to D7 connected to the data terminals D0 to D7 of the first ROM 52; a liquid crystal display device 63 having the input terminals D0 to D7 connected to output terminals Q0 to Q7 of the first latch 62 and an enable terminal E connected to a write terminal (-WR) of the self-test controller 4 and a write terminal (WR) of the random access memory 53; a second latch 71 having an enable terminal C connected to an output terminal Y1 of the decoder 61 and output terminals Q0 to Q7 connected to the data terminals D0 to D7 of the first ROM 52; a second latch 72 having an enable terminal C connected to an output terminal Y2 of the decoder 61 and output terminals Q0 to Q7 connected to the data terminals D0 to D7 of the first ROM 52; and a keyboard 73 having input terminals D0 to D7 of the first and second latches 71 and 72.

The self-test system of the electronic component controlling device and the operation of the self-test system are described as follows.

First, power B+ is turned on to operate the power supply 1 and perform the operation of each device by changing the applied power B+ to a suitable power level.

The operation of the power supply 1 is as follows.

A signal applied from power B+ goes by way of a filter having capacitors C1, C2 and coil L1 to remove unnecessary noise. After the signal is rectified, going by way of the diode D1, the signal is applied to the first and second voltage regulators 11 and 12.

Accordingly, power Vcc that varies by the operation of the first voltage regulator 11 is outputted from the first power output terminal, by way of the capacitors C4 and C5. Accordingly, power may be supplied to each device using the power Vcc.

The power B+ is applied to the second voltage regulator 12 and varies by the operation of the second voltage regulator 12 like the first voltage regulator 11, and is outputted from the second power output terminal Vdd via the capacitor C6. Accordingly, the power may be supplied to each device using the appropriate power.

The voltage, raised as much as a threshold voltage of the diode D2 from the power produced from the second power output terminal Vdd, is produced via third power output terminal $V_{EE}$, and the power of corresponding grounded level is produced via a fourth power output terminal GND connected to a minus (−) terminal of the capacitor C7 that is connected to the cathode terminal of the diode D2.

The power produced from the third and fourth power output terminals $V_{EE}$ and GND serve as clipping voltage for removing noise generated when the communication operation of corresponding data is performed. There are removed all signals out of a range predetermined by power outputted to the third and fourth power output terminals $V_{EE}$ and GND.

That is, if the operation starts (S10), by applying the power to each device, the self-test controller 4 initializes the state of each device used (S20).

After that, the self-test controller 4 outputs data to the data output member 6 to display an initial screen (S30) before the actual operation starts, and outputs data about all aspects of the vehicle that are applied at present.

Accordingly, the user may select data about the vehicle type to perform the self-test operation by means of the keyboard 73 of the data input member 7.

The user inputs the data about the vehicle type so that the self-test controller 4 may operate in response to the selected vehicle type.

In this occasion, the self-test controller 4 outputs corresponding data to the data output member 6, or if the data about the vehicle type via the keyboard 73 of the data input member 7 is inputted by the user, the operation is as follows.

First, if the self-test controller 4 stores corresponding data in the memory 5 or reads the stored data, the self-test controller 4 outputs an enable signal to the enable terminal C of the latch 51 of the memory 5 via the address latch enable terminal ALE.

If the latch 51 is enabled by the signal inputted from the self-test-controller 4, the self-test controller 4 outputs corresponding data via the first ports P0.0 to P0.7 to output the data to the output terminals Q0 to Q7, going by way of the input terminals D0 to D7 of the latch 51.

If a corresponding memory 52 or 54 of the memory 5 is selected according to the level of a signal of the read terminal -RD, the write terminal -WR, and the program store enable terminal PSEN of the self-test controller 4, the signal produced from the output terminals Q0 to Q7 and the signal produced via the third ports P2.0 to P2.7 of the self-test controller 4 are applied to each address terminal A0 to A14 of the selected memory 52 or 54.

Therefore, according to the signal applied to the address terminals A0 to A15, a corresponding address is selected, and data applied to the data terminals D0 to D7 via data bus connected to the first ports P0.0 to P0.7 of the self-test controller 4 is stored in a selected address, or data corresponding to the selected address via the address signals A0 to A15 is applied to the self-test controller 4 via the address bus D0 to D7.

The operation of RAM 53 of the memory 5 depends on the read terminal -RD and write terminal -WR of the self-test controller 4.

One of the first or second ROM 52 or 54 is selected to be enabled according to the terminal P2.7 of the third port connected to the chip selection terminal CS. The read operation of the selected ROM 52 or 54 is performed by the program store enable signal (PSEN) of the self-test controller 4.

If a high level signal "H" is produced to the terminal P2.7 of the third port of the self-test controller 4, the high level signal "H" is applied to the chip selection terminal CS of the first ROM 52 to enable the first ROM 52 but a low level signal "L", reversed by the NAND gate NAND51, is applied to the second ROM 54 not to enable the second ROM 54.

If the low level signal "L" is produced to the terminal P2.7 of the third port of the self-test controller 4, the second ROM 54 is selected by the reversion of the NAND gate NAND51, and the self-test controller 4 may read data of the address selected by the address signals A0 to A7.

The self-test controller 4 may store data in the address selected by the address signals A0 to A15 or may read data stored in the corresponding address.

A driving program for operating the self-test system of fixed data that does not vary according to the vehicle types is stored in the first ROM 52 of the memory 5, the characteristic data equivalent to the characteristics of the selected vehicle that varies according to the vehicle types is stored in the second ROM 54 of the memory 5.

The second ROM 54 is designed to be removable, and if the vehicle type in which the self-test system is installed varies, just the second ROM 54 that varies according to the vehicle type may be changed without installing a new self-test system. Therefore, even if the vehicle type is changed, such a design can reduce the cost and time required.

The following description is about the operation in which the self-test controller 4 outputs a corresponding data to the data display 6 or reads data inputted through the data input member 7 by the user.

First, the self-test controller 4 applies a signal of the address bus A0 to A14 that is produced from the first and third ports P0.0 to P0.7 and P2.0 to P2.7 to the input terminals A to C of the decoder 61.

The signal of the address bus A0 to A14 applied to the input terminals A to C of the decoder 61 is produced to the output terminals Y0 to Y7 of the decoder 61, and one of the first to third latches 62, 71 and 72 is enabled according to the output signals Y0 to Y2 of the decoder 61.

Provided the first latch 62 is enabled, and a signal is produced to the enable terminal E of the liquid crystal display device 63 of the data display 63 via the write terminal WR of the self-test controller 4 to make the liquid crystal display device 63 enabled, data signals D0 to D7 produced via the first ports P0.0 to P0.7 of the self-test controller 4 are applied to one selected terminal from among the input terminals D0 to D7 of the first latch 62.

Accordingly, the data signals D0 to D7 are produced to the output terminals Q0 to Q7 of the first latch 62 and applied to the input terminals D0 to D7 of the liquid crystal display device 63 so that data produced from the self-test controller 4 is produced to the data display device 63.

In a case that the second or third latch 71 or 72 is selected by the address signals A0 to A7 of the self-test controller 4, data inputted by means of the keyboard 73 of the user is applied to the input terminals D0 to D7 of the selected second or third latch 71 or 72, and then is inputted through the first ports P0.0 to P0.7 of the self-test controller 4, by way of the data bus D0 to D7.

The initial data applied via the data bus of the self-test controller 4, is produced to the data output member 6 through the above-mentioned operation, and the self-test controller 4 outputs to the data output member 6 a vehicle type that can perform the self-test operation of the electronic controller 2 by means of the data bus (S40).

Accordingly, the vehicle type used by the user at present may be selected and there can be performed the operation corresponding to the operation characteristics of each electronic component controller 2 of the selected vehicle type.

After that, the self-test controller 4 determines (S50) if the user selects the proper vehicle type by means of the keyboard 73 of the data input member 7, and after one vehicle type is selected, it determines (S60) if a selection cancelling key that can cancel the selected vehicle type operates or not.

If the selection cancelling key provided in the keyboard 73 operates to input a corresponding signal to the self-test -controller 4, the self-test controller 4 determines that the wrong vehicle is selected or the self-test operation stops, and then jumps to the initializing step. Unless a user selects the vehicle type displayed through the data output member 6, the self-test controller 4 goes on determining (S50) if a corresponding vehicle type is selected.

If there is no operation of the selection cancelling key after the vehicle type is selected by the keyboard 73, the self-test controller 4 displays (S70) the names of all the electronic controlling devices of the electronic controller 2 mounted on the selected vehicle.

The user can select the electronic controlling device that is performing the self-test operation, using the keyboard 73 of the data input member 7, like the case when the vehicle type is selected.

If the user selects a corresponding electronic controlling device of the electronic controller 2 to determine the operation state, using the input key of the keyboard 73, the self-test controller 4 determines (S90) if a corresponding signal is inputted by the operation of the selection cancelling key that can cancel the selected electronic controlling device for determining the operation state.

Unless the electronic controlling device for performing the self-test operation is selected, the self-test controller 4 goes on determining (S80) if the electronic controlling device for perceiving the operation state is selected.

Accordingly, if the selection cancelling key of the keyboard 73 operates to input a corresponding data, the self-test controller 4 does not perform the self-test operation of the selected electronic controlling device and passes again the step (S50) for selecting the vehicle type to perform the self-test to select another electronic controlling device.

Unless the selection input key is inputted, the self-test controller 4 outputs (S100) all the self-test functions for testing the operation of the electronic controlling device of the selected vehicle type through the liquid crystal display device 63 of the data output member 6.

In this occasion, the operations produced via the liquid crystal display device 63 of the data output member 6 according to the operation of the self-test controller 4, are characterized as a self-test operation, service data output operation, compulsory driving operation, and error mode removal operation.

The user selects a desired operation from among the above to determine the selected operation result of operation state of the electronic controlling device. The self-test controller 4 determines (S110) which one of the above operations displayed in the liquid crystal display device 63 is selected by the operation of the keyboard 73.

If the data corresponding to the operation selected by means of the keyboard 73 is applied to the self-test controller 4, the self-test controller 4 determines (S120) if the selection cancelling signal to cancel the selected operation is applied.

The selection cancelling signal is inputted by means of the keyboard 73 in an effort to prevent an unnecessary operation from being performed by selecting a wrong operation. If the selection cancelling signal to cancel the selected operation is inputted to the self-test controller 4 by the operation of the keyboard 73, the self-test controlling device 4 jumps to the stop (S70) for outputting all kinds of the electronic component controlling devices mounted on the selected vehicle to the data display device 63 of the data output member 6.

However, if the signal to cancel the selected operation is not inputted, the self-test controller 4 performs (S130) the selecting operation as to a selected electronic component controlling device of the electronic component controller 2.

The communication for performing the selected operation is carried out and the self-test controller 4 transmits (S131) a command for confirming a serial number to determine the selected electronic controlling device of the electronic component controller 2 via the first interface part 3.

The corresponding electronic controlling device of the electronic controller 2 transmits to the self-test controller 4 data corresponding to its serial number according to the received command signal via the first interface 3 so that the self-test controller 4 may receive the data.

If the self-test controller 4 receives (S132) a data corresponding to a serial number from the corresponding electronic component controlling device, the received data is compared to the data stored in the memory 5 to determine if the communication is available via the selected electronic controlling device by determining if there is the same data.

In case there is no data having a number that is the same as a serial number perceived by the received data, the self-test controller 4 determines that the communication with the selected electronic component controller part is not available. In case there is data having a number the same as the serial number of the received data, the self-test-controller 4 determines the electronic controlling device selected by the user so that the communication operation for performing a predetermined function is determined to be available.

If the communication is determined to be unavailable, the self-test controller 4 jumps to step S70 for re-selecting one electronic controlling device. In case the selected electronic controlling device is determined to be available for communication, the self-test controller 4 perceives a selected operation (S135).

At this point, in case the operation selected by means of the keyboard 73 is a self-testing one (S135), the self-test controller 4 displays (S136) all the checking items of the selected electronic controlling device through the liquid crystal display device 63 of the data output member 6.

In case a checking item is selected from among them by determining (S137) if the corresponding signal is inputted to the self-test controller 4 by selecting one checking item by means of the keyboard 73, the self-test controller 4 transmits (S138) an address signal corresponding to the selected item to the corresponding electronic controlling device.

However, unless such a separate selection operation is performed, the checking item is outputted via the data output member 6. Subsequently, the corresponding electronic device outputs (S139) data corresponding to the selected address to determine if the operation corresponding to the selected item of the electronic component controlling device is in a normal or an abnormal condition.

In case the signal received from the selected electronic controlling device is "00" the operation of the selected item is determined to be in a normal condition, and in case the received signal is "FF" the operation of the selected item is determined to be in an abnormal condition. The self-test controller 4 outputs (S1310) such a checking condition to the data output member 6.

If a selection cancelling signal is received from the keyboard 73 during the selected operation, the self-test controller 5 stops the performance of the operation, and then jumps to the step (S100) for displaying the kinds of operation that may operate again.

Accordingly, the condition of the corresponding operation may be determined by means of data of each item predetermined to perform the self-test operation. Thus, if the self-test operation is selected and the state of one operation selected from the operations of the electronic controlling device is examined, the self-test controller 4 reads a corresponding address by means of a signal of the address having the resultant state of the selected operation.

Therefore, it may be determined if the selected operation is in a normal or abnormal state.

However, if a service data outputting function is selected (S1311) without selecting the self-test operation, the self-test controller 4 outputs (S1312) all kinds of data that may be produced from the selected electronic controlling device via the liquid crystal display 63 of the data output member 6 in such a manner that the kind of data that is outputted by the operation of the keyboard 73 may be selected.

The self-test controller 4 determines (S1313) if data of any one kind is selected from among the kinds of data displayed via the liquid crystal display 63 by means of the keyboard 73, and if a signal for selecting the corresponding data is inputted through the keyboard 73, the self-test controller 4 outputs (S1314) a corresponding address signal including the kind of data chosen by the selected electronic component controlling device.

Therefore, the electronic component controlling device outputs the content of the memory corresponding to the received address signal via the first interface 3 to recognize data stored in the corresponding address of the electronic controlling device.

As mentioned above, the data transmitted from the electronic component controlling device via the first interface 3 is received (S1315), and the self-test controller 4 outputs (S1316) the content of the received data via the data output member 6 so that the contents of the data may be confirmed.

The self-test controller 4 reads data stored in the corresponding address of the memory of the electronic controlling device and outputs it through the data output member 6, if a resultant data of the selected electronic controlling device is produced.

If a signal for stopping the output operation of the corresponding data during the performance is inputted to the self-test controller 4 from the keyboard 73 of the data input member 7, the self-test controller 4 stops the data output operation and jumps to the step (S70) for selecting by outputting all the operations that may be performed.

In case the selected operation is not the service data output one but the compulsory driving operation (S1317), the self-test controller 4 displays all the kinds of items that may be performed (S1318) to select an item requiring the operation. After that, the self-test controller 4 determines (S1319) if the desired operation is selected by means of the keyboard 73 of the data input member 7.

In addition, if the corresponding signal is inputted by selecting any one driving item from among all the driving items displayed by means of the keyboard 73 of the data input member 7, the self-test controller 4 inputs (S1320) a command of the selected operation to the corresponding electronic controlling device of the electronic controller 2 via the first interface 3.

The self-test-controller 4 determines (S1321) if a driving resultant signal is received within a predetermined period of time, and if the driving resultant signal is received, the self-test-controller 4 receives (S1322) a driving result via the liquid crystal display device 63 of the data output member 6.

At this point, if the signal "00" is received by the electronic controlling device, the driving operation is performed in a normal way, and then the corresponding content is produced. If a signal "FF" is received, the driving operation is not performed, and its corresponding content is produced.

However, in case the driving resultant signal is not received within a predetermined period of time, the self-test controller 4 determines that the driving operation is not performed in a normal way to output the corresponding content via the data output member 6 (S1323).

However, if there is not a compulsory driving operation, the self-test controller 4 determines (S1324) the operation as an error code removal operation, and determines (S1325) if there is a signal for turning the error occurrence code into a code of an initial stage to the self-test controller 4 via the keyboard 73.

The above error occurrence code is a signal that can determine whether the operation is performed normally or abnormally. If a signal for initializing the error occurrence code is inputted, the self-test controller 4 varies all the error occurrence codes of the selected electronic controlling device to reset (S1326) them to be in a normal condition.

The result produced by the removal operation of the error occurrence code is outputted to the self-test controller 4 so that the result of the operation may be produced (S1327) via the data output member 6.

Therefore, if the signal "00" is received by the self-test controller 4, the self-test controller 4 determines that the error occurrence code removal operation is performed in a normal way thereby outputting the result of the operation to the data output member 6.

If the signal "FF" is received by the self-test controller 4, the self-test controller 4 determines that the error occurrence code removal operation is not performed in a normal way thereby outputting the result of the mis-operation to the data output member 6.

Therefore, if the normal operation is available by keeping in order the parts having errors, the error occurrence code stored in the memory part of the corresponding electronic controlling device is changed to be in a normal condition by means of the keyboard 73 of the data input member 7.

In case a predetermined signal for cancelling the selected operation during the performance is inputted by means of the keyboard 73 according to the operation of the self-test controller 4, the self-test controller 4 stops performing the operation and keeps the condition that can select the operation state of the prior step.

Besides, if abnormality occurs in the mounted self-test controller 4 or wrong data is inputted not to perform the normal operation, the user may determine directly the operation state of the corresponding electronic controlling device of the electronic controller 2, using the programs of a computer 9 that is installed on an outer part, and may output the result of the operation.

Therefore, if the data corresponding to the selected electronic controlling device is inputted in error not to perform the communication with the self-test controller 4, the communication with the selected electronic controlling device and the computer is attained by confirming the exact data by means of the computer so that the computer may perform the operation of the self-test controller 4 and the result of the operation may be outputted via a monitor of the computer.

Accordingly, a new self-test controller 4 that can perform the exact operation by means of the data newly obtained through the communication with the computer, may be designed.

In addition, through the self-test controller 4 and second interface 8 that perform normal operation, the operation result of the self-test controller 4 may be confirmed by means of the computer 9 directly connected to the outside to enhance the convenience of the user.

The watch dog 101 perceives the time when a reset switch (not illustrated) operates to reset the operation of the system and reset the self-test controller 4.

In addition, if the power is not stable and drops below a predetermined level of voltage, the watch dog 101 initializes the operation of the self-test controller 4 and protects the data stored in the memory 5, by applying a predetermined amount of voltage to the memory 5.

The present invention has an advantage that the causes of disorder in the electronic device may be easily figured out since the operation state and operation are the result of the electronic controlling devices mounted respectively to the vehicle types.

In case the communication with each electronic controlling device is not available due to the abnormality of the self-test controller, necessary data may be produced by performing an operation selected by directly communicating with the electronic controlling device, installing the computer outside. Therefore, the self-test controller having the abnormality may be newly designed, and an exact test operation may be performed prior to designing the self-test controller.

In addition, by storing the data that varies according to each vehicle type in a memory device that may be mounted or removed, all that is necessary is to change the removable memory device every time the vehicle type is changed, which can save much time.

What is claimed is:

1. A self-test system of an electronic component controlling device both disposed on a vehicle and comprising:

power supply means for supplying power to each of a plurality of electronic components of the vehicle and to said self-test system;

an electronic component controller having a plurality of electronic component controlling devices for outputting a control signal to selectively enable operation of each of said plurality of electronic components of the vehicle;

a first interface connected to said electronic component controller;

self-test control means, connected to said power supply means and to said first interface, for displaying a plurality of vehicle types for selection and for confirming the operation state of each of the plurality of electronic component controlling devices of each vehicle type, selecting a desired electronic component controlling device subsequent to displaying an entirety of said plurality of electronic component controlling devices mounted on the selected vehicle, provided the vehicle type is selected from among the displayed vehicle types, selecting a desired operation subsequent to displaying a plurality of operations that can be performed, provided a corresponding electronic component controlling device is selected, interrupting the selecting of a desired operation and performing the operation of the previous step of selecting a desired electronic component controlling device, provided a signal for interrupting the operation is selected from among the operations and outputting a signal responsive to an operation of said self-test control means;

memory means, connected to said self-test control means, for storing predetermined data and reading the stored data;

data output means, connected to said self-test control means and to said memory means, for outputting data applied from said self-test control means according to the output signal of said self-test control means; and data input means, connected to the data output means and to said self-test control means, for enabling said self-test control means to select the electronic component controlling device of a desired vehicle and determine the operation state of the selected electronic component.

2. (Amended) The self-test system according to claim 1, further comprising a second interface and a computer that can perform function of the self-test control means by directly communicating the electronic component controller and data inputted to or outputted from the electronic component controller with the self-test control means.

3. The self-test system according to claim 1, further comprising a watch dog for resetting said self-test control means and supplying power to said memory means to protect the data stored in said memory means, provided a predetermined operation is not performed because of an unstable power supply.

4. The self-test system according to claim 1, wherein said power supply means includes:

capacitors and a coil for filtering a signal applied from said power supply means;

a first diode for rectifying the filtered signal;

a first voltage regulator connected to said first diode and changing the applied power to a first voltage;

a second voltage regulator connected to said first diode and changing the applied power to a second voltage;

a second diode connected to said second regulator and changing the second voltage to a third voltage; and a capacitor and a third diode connected to said second diode and changing the third voltage to a fourth voltage.

5. The self-test system according to claim 1, wherein said self-test control means is self-testing, outputs a service data, and removes error codes.

6. The self-test system according to claim 1, wherein said memory means stores varying data according to a selected vehicle type and includes a removable read only memory.

7. A self-testing method of an electronic component controlling device for confirming an operation state of the electronic component controlling device disposed on a vehicle, comprises the steps of:

displaying a plurality of vehicle types through data output means disposed on the vehicle;

selecting a vehicle type from said plurality of displayed vehicle types in said step of displaying;

listing all the electronic component controlling devices mounted on a selected vehicle, provided a vehicle type is selected from among the plurality of displayed vehicle types by a data input device;

indicating a testing procedure that can be performed, provided the electronic component controlling device is selected from among the listed electronic component controlling devices by the data input device; and performing a predetermined component testing procedure by determining which electronic component controlling device is selected by the data input device from among the indicated testing procedures.

8. The self-test system according to claim 7, wherein if a selection is made to determine the state of a selected electronic component controlling device, a command for transmitting data corresponding to a serial number of the selected electronic component controlling device is applied to the electronic component controlling device, and if the command is received, the electronic component controlling device transmits data corresponding to the serial number of the electronic component controlling device, and the transmitted data is available provided the transmitted data is the same as the received data, and the transmitted data is unavailable provided the transmitted data is not the same as the received data.

9. The self-testing method according to claim 7, wherein said testing procedures include a self-testing procedure, a service data output procedure, and an error code removal procedure.

10. The self-testing method according to claim 7 or 9, wherein if said predetermined procedure is a self-testing procedure, the self-testing procedure comprises the steps of:

displaying a plurality of items that can be self-tested through said data output means;

transmitting an address signal of a memory storing the result of the operation state of a selected item, if one item is selected according to the operation of the data input device from among the displayed items;

transmitting the data stored in the transmitted address by the corresponding electronic component controlling device; and outputting the operation result of an item selected according to the state of the data transmitted from the selected electronic component controlling device.

11. The self-testing method according to claim 7 or 9, in a case of a service data output procedure, comprising the steps of:

displaying data output that may be produced via said data output means;

transmitting an address signal of a memory storing a selected data to a corresponding electronic component controlling device, if one data output is selected by the data input device from among the displayed data;

transmitting a data stored in the transmitted address by the corresponding electronic component controlling device; and outputting the data transmitted from said corresponding electronic component controlling device to the data output means.

12. The self-testing method according to claim 7 or 9, in a case of a service data output procedure, comprising the steps of:

displaying data output that may be produced via said data output means;

transmitting a command corresponding to a selected driving item, if one driving item is selected by the data input device from among the displayed driving data;

outputting to the data output means a normal operation or an operation result of error occurrence by means of a received data, if a signal for showing the operation result according to the received command is received within a predetermined period of time; and outputting an error occurrence state to the data output means, unless the signal showing the operation result according to the received command is received within a predetermined period of time.

13. The self-testing method according to claim 9, in a case of an error code removal procedure, comprising the steps of:

transmitting a driving command for initializing an error code to a corresponding electronic component controlling device, if a signal corresponding to the error code removal procedure is inputted from the data input device; and outputting to the data output means an information whether the procedure is finished normally or an error is generated, by receiving a signal for showing a procedure result according to the received command.

14. A system for self-testing a plurality of electronic devices disposed on a vehicle, said system being disposed on the vehicle, comprising:

output means for displaying for selection a plurality of vehicle types;

input means for selecting one of the displayed vehicle types corresponding to the vehicle, said output means displaying a plurality of electronic devices corresponding to the selected vehicle type, said input means receiving a device selection from the displayed electronic devices, said output means displaying a plurality of operations to be performed corresponding to the device selection, said input means receiving an operation selection from the displayed operations; and self-test control means for controlling said output means and said input means so as to carry out an operation according to the operation selection.

15. The system of claim 14, wherein said plurality of operations include a self-test operation, a service data output operation, a compulsory driving operation, and an error code removal operation.

16. The system of claim 15, further comprising:

memory means for storing data being displayed by said output means and data being received by said input means, wherein access to said memory means is controlled by said self-test control means; and power means for supplying power to said vehicle and said output, input, self-test control and memory means.

17. The system of claim 16, wherein said self-test control means includes a plurality of electronic device controllers for outputting a control signal to control the electronic devices, said self-test control means confirming the operation state of each of said electronic device controllers.

\* \* \* \* \*